(12) United States Patent
Yamashita

(10) Patent No.: US 7,049,841 B2
(45) Date of Patent: May 23, 2006

(54) HEATER-EQUIPPED PUSHER, ELECTRONIC COMPONENT HANDLING APPARATUS, AND TEMPERATURE CONTROL METHOD FOR ELECTRONIC COMPONENT

(75) Inventor: Tsuyoshi Yamashita, Tokyo (JP)

(73) Assignee: Advantest Corporation, Tokyo (JP)

( * ) Notice: Subject to any disclaimer, the term of this patent is extended or adjusted under 35 U.S.C. 154(b) by 19 days.

(21) Appl. No.: 10/729,975

(22) Filed: Dec. 9, 2003

(65) Prior Publication Data

US 2004/0113646 A1 Jun. 17, 2004

(30) Foreign Application Priority Data

Jul. 12, 2001 (JP) ............... 2001-212499

(51) Int. Cl.
*G01R 31/02* (2006.01)
(52) U.S. Cl. ................................ 324/760
(58) Field of Classification Search ............... 324/73.1, 324/158.1, 754, 755, 758, 760, 765; 209/571, 209/573; 219/209, 210, 494, 497; 414/416, 414/422, 783, 940
See application file for complete search history.

(56) References Cited

U.S. PATENT DOCUMENTS

| | | | | |
|---|---|---|---|---|
| 5,742,168 A | * | 4/1998 | Kiyokawa et al. | 324/754 |
| 5,821,505 A | * | 10/1998 | Tustaniwskyj et al. | 324/760 |
| 5,844,208 A | * | 12/1998 | Tustaniwskyj et al. | 324/537 |
| 5,864,176 A | * | 1/1999 | Babock et al. | 257/714 |
| 6,147,506 A | * | 11/2000 | Ahmad et al. | 324/760 |
| 6,313,653 B1 | * | 11/2001 | Takahashi et al. | 324/760 |
| 6,445,203 B1 | * | 9/2002 | Yamashita et al. | 324/760 |
| 6,456,062 B1 | * | 9/2002 | Yamashita et al. | 324/158.1 |
| 6,489,793 B1 | * | 12/2002 | Jones et al. | 324/760 |
| 6,498,899 B1 | * | 12/2002 | Malinoski et al. | 73/863.11 |
| 6,590,383 B1 | * | 7/2003 | Yamashita et al. | 324/158.1 |
| 6,593,761 B1 | * | 7/2003 | Fukasawa et al. | 324/754 |
| 6,741,090 B1 | * | 5/2004 | Yamashita | 324/755 |
| 6,788,084 B1 | * | 9/2004 | Jones et al. | 324/760 |
| 2002/0109518 A1 | * | 8/2002 | Saito et al. | 324/760 |
| 2004/0124846 A1 | * | 7/2004 | Yamashita et al. | 324/537 |

FOREIGN PATENT DOCUMENTS

| | | |
|---|---|---|
| JP | A-H08-15369 | 1/1996 |
| JP | A-2000-187060 | 7/2000 |

* cited by examiner

*Primary Examiner*—Jermele Hollington
(74) *Attorney, Agent, or Firm*—Posz Law Group, PLC

(57) ABSTRACT

A pusher is constituted by a pusher main body, which is capable of direct contact with an electronic component to be tested, a heat absorbing and radiating body provided on the pusher main body, a heater provided on the pusher main body to enable direct or indirect contact with the electronic component to be tested, and a thermal insulating material provided between the pusher main body and the heater. According to such a pusher, temperature control of an electronic component can be performed such that the electronic component nears a target set temperature for testing.

5 Claims, 14 Drawing Sheets

HEATER-EQUIPPED PUSHER, ELECTRONIC COMPONENT HANDLING APPARATUS, AND TEMPERATURE CONTROL METHOD FOR ELECTRONIC COMPONENT

TECHNICAL FIELD

The present invention relates to a pusher which is capable of performing temperature control on an electronic component such as an IC device in an apparatus for testing electronic components, an electronic component handling apparatus comprising such a pusher, and a temperature control method for an electronic component.

BACKGROUND ART

In a manufacturing process for an electronic component such as an IC device, a testing apparatus is required for testing the electronic component which is finally manufactured. An apparatus for testing a plurality of IC devices at one time under higher temperature conditions than normal temperature (thermal stress conditions) is known as one type of such a testing apparatus.

In this testing apparatus, a test chamber is formed in the upper portion of a test head, and while the interior of the test chamber is controlled to a predetermined set temperature using air, a test tray supporting a plurality of IC devices which have been similarly preheated to the predetermined set temperature is transported to a socket on the test head. A test is then performed using a pusher to push the IC devices into the socket and connect the IC devices. By means of such a test performed under thermal stress, IC devices are tested and sorted into at least good and defective products.

However, in the aforementioned test chamber, heat escapes from the outer walls or the socket, and as a result the temperature of the pusher which is on standby near the center of the test chamber rises beyond the set temperature, whereas the temperature of the socket falls below the set temperature. If an IC device which has been preheated to a predetermined set temperature is pushed into the socket by the pusher in these conditions, the IC device is affected by the pusher, which has a higher temperature than the set temperature, such that the temperature thereof initially rises, and is then affected by the socket, which has a lower temperature than the set temperature, such that the temperature thereof falls. If the IC device is of a type which generates heat itself during operations (during a test), then the temperature of the IC device may rise even further above the set temperature during the test.

When the temperature of an IC device diverges so greatly from the set temperature, it is impossible to perform an accurate test on the IC device. For example, if a test is performed on an IC device at a much lower temperature than the set temperature, defective products may be judged to be good products, and if a test is performed on an IC device at a much higher temperature than the set temperature, good products are judged to be defective products such that yield deteriorates.

Configurations for controlling the temperature of an IC device by interposing a heater between a pusher serving as a heat sink and an IC device have been disclosed (U.S. Pat. No. 5,821,505, No. 5,844,208, and No. 5,864,176). In order to generate a cooling effect in the heat sink in such configurations, the thermal resistance between the IC device and the heat sink, or in other words the thermal resistance between the IC device and heater and between the heater and heat sink must be reduced, but in so doing, when the IC device is heated by the heater, the heat sink is also heated, and thus when attempts are made to cool the IC device, the IC device cannot be effectively cooled since the heat sink is warm.

DISCLOSURE OF THE INVENTION

The present invention has been designed in consideration of such circumstances, and it is an object thereof to provide a pusher, an electronic component handling apparatus, and a temperature control method which are capable of performing temperature control such that an electronic component reaches the vicinity of a target set testing temperature.

In order to achieve this object, a heater-equipped pusher according to the present invention is used for pushing a terminal of an electronic component to be tested in an electronic component handling apparatus into a contact portion of a test head, and is characterized in comprising a pusher main body which is capable of direct contact with the electronic component to be tested, a heat absorbing and radiating body (heat sink) provided on the pusher main body, a heater provided on the pusher main body to enable direct or indirect contact with the electronic component to be tested, and a thermal insulating material provided between the pusher main body and the heater (1).

This heater may be provided in the lower portion of the pusher main body so as to be exposed on the same plane as the lower surface of the pusher main body, and in this constitution a heat transfer plate (forming a part of the pusher main body) may be provided on the lower end of the pusher. In this case, it is preferable that the heat transfer plate be made of thin plate or a heat transfer anisotropic material so that heat is easily transferred in the direction of thickness but not easily transferred in the planar direction.

Further, an electronic component handling apparatus according to the present invention which, in order to test an electronic component, is capable of pushing a terminal of an electronic component to be tested into a contact portion of a test head, is characterized in comprising the aforementioned heater-equipped pusher (claim 1) (2).

Further, a temperature control method for an electronic component according to the present invention is used during the testing of the electronic component to be tested in an electronic component handling apparatus, and is characterized in that cooling of the electronic component to be tested is performed by cooling a heat absorbing and radiating body to which the heat of the electronic component is transferred, and heating of the electronic component to be tested is performed by a heater which is provided such that thermal resistance with the body increases (3).

In the present invention, when the temperature of the pusher rises above a predetermined set temperature, the heat absorbing and radiating body provided on the pusher main body absorbs and radiates the heat (heat absorption and radiation) in the pusher, and thus the temperature of the electronic component to be tested which is pushed by the pusher can be prevented from rising excessively above the set temperature. When the contact portion of the test head is lower than the predetermined set temperature, heat is generated in the heater such that the electronic component to be tested contacting the heater is heated and thus nears the set temperature. When the electronic component to be tested reaches a higher temperature than the set temperature due to self-induced heat generation, the heat in the electronic component to be tested is transferred from the pusher main body to the heat absorbing and radiating body and radiated out from the heat absorbing and radiating body. Here, a thermal insulating material is provided between the heat absorbing and radiating body and the heater, thereby preventing the heat absorbing and radiating body from warming by the heat of the heater, with the result that heat can be radiated out from the heat absorbing and radiating body effectively. In other words, excessive temperature rises in the electronic component to be tested can be prevented even when the electronic component to be tested reaches a higher temperature than the set temperature due to self-induced heat generation, and thus the electronic component to be tested can be controlled to a temperature in the vicinity of the set temperature.

BEST MODE FOR CARRYING OUT THE INVENTION

An embodiment of the present invention will be described herein below on the basis of the drawings.

Figure 1:
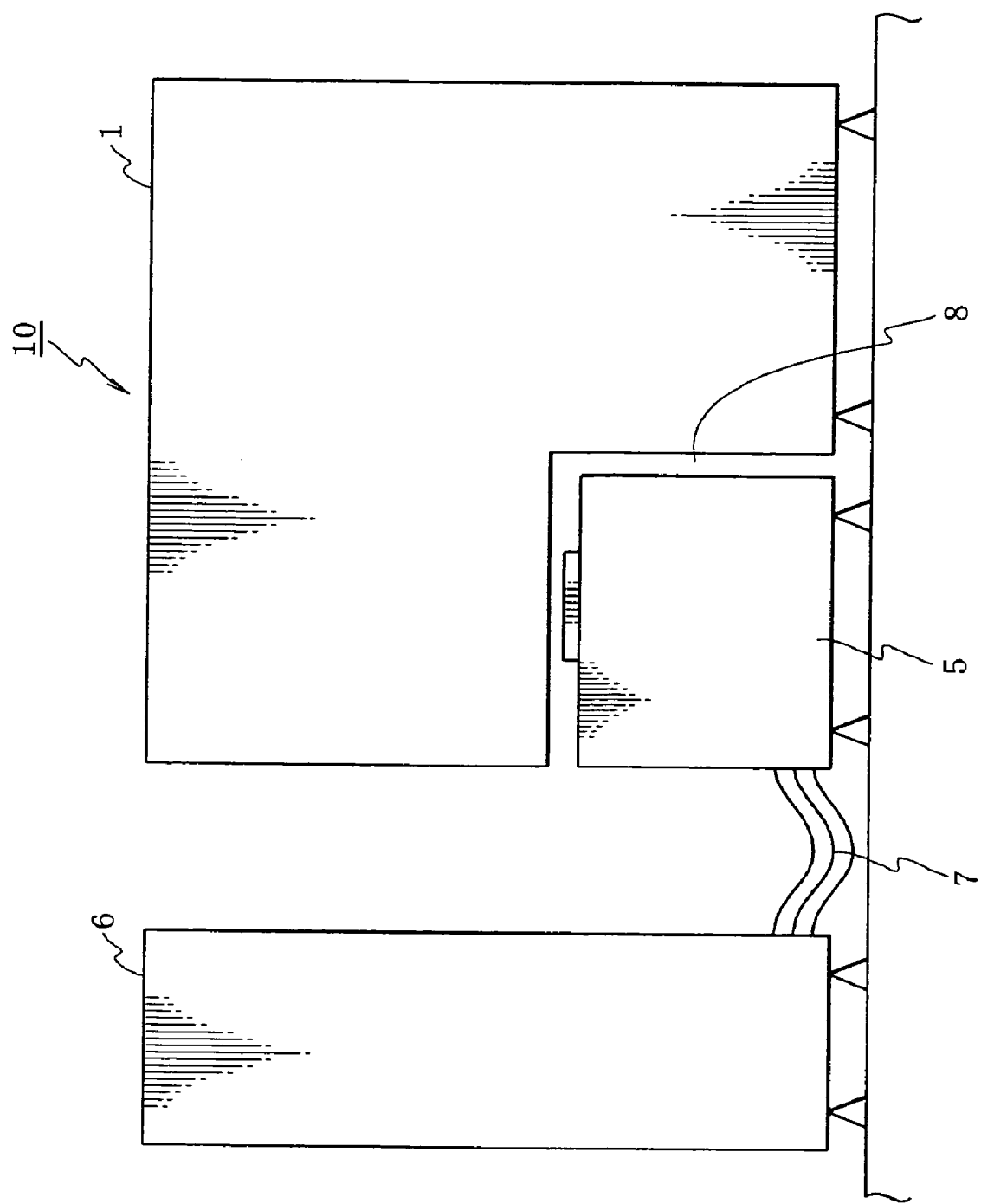
FIG. 1 is an overall side view of an IC device testing apparatus comprising a handler according to an embodiment of the present invention.

First, the overall constitution of an IC device testing apparatus comprising a handler according to an embodiment of the present invention will be described. As shown in FIG. 1, an IC device testing apparatus 10 comprises a handler 1, a test head 5, and a main testing apparatus 6. The handler 1 executes an operation to successively transport IC devices (an example of an electronic component) subject to testing to a socket provided on the test head 5, classify the tested IC devices according to the test results, and store the tested IC devices in predetermined trays.

The socket provided on the test head 5 is electrically connected to the main testing apparatus 6 through a cable 7 so as to connect the IC devices which are removably installed in the socket to the main testing apparatus 6 through the cable 7. The IC devices are tested by means of an electric testing signal from the main testing apparatus 6.

The lower portion of the handler 1 is mainly occupied by an in-built control apparatus for controlling the handler 1, but is partly occupied by a space 8. The test head 5 is replaceably disposed in this space 8 such that the IC devices can be installed in the socket on the test head 5 via a through hole formed in the handler 1.

Figure 2:
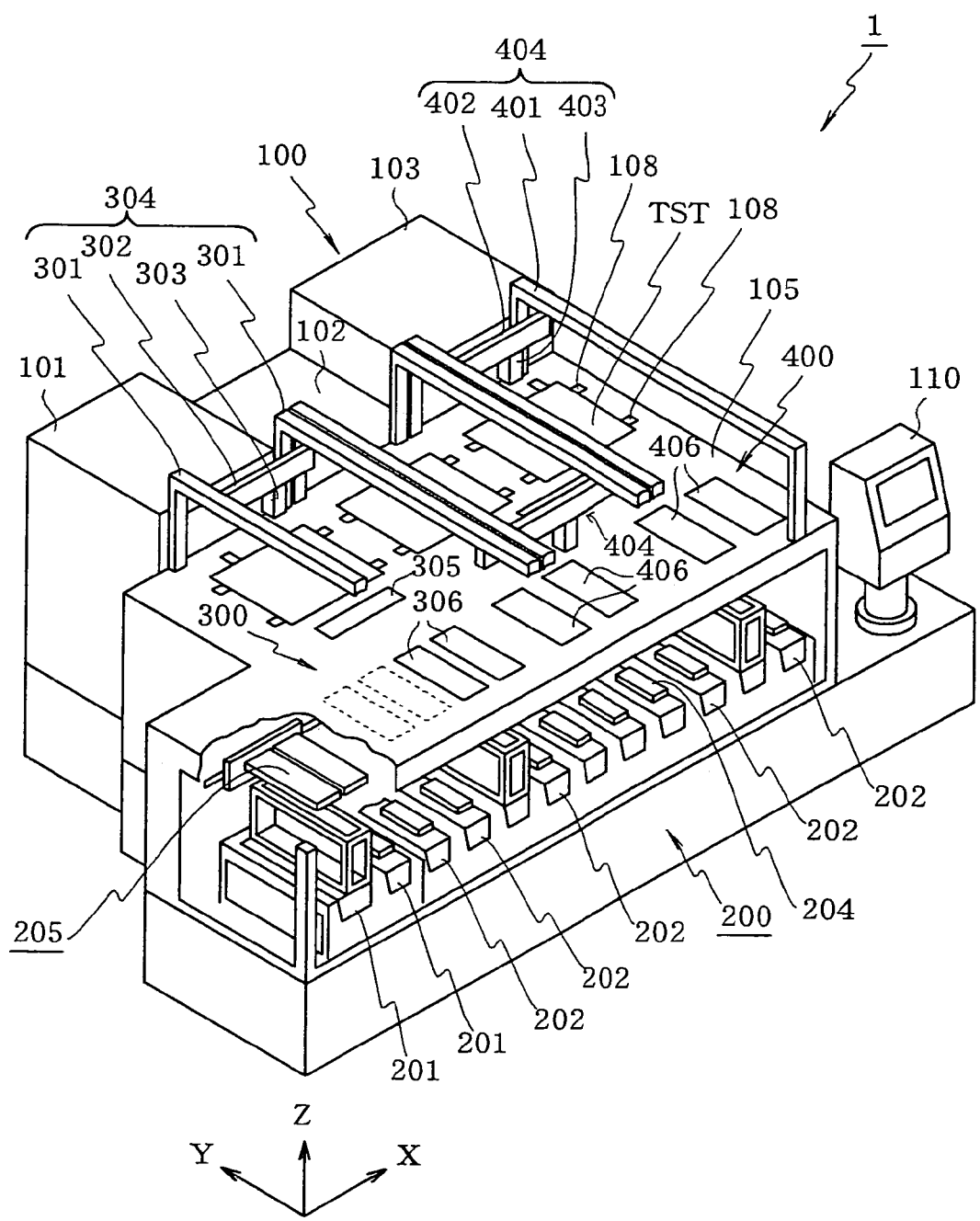
FIG. 2 is a perspective view of the handler illustrated in FIG. 1.
Figure 3:
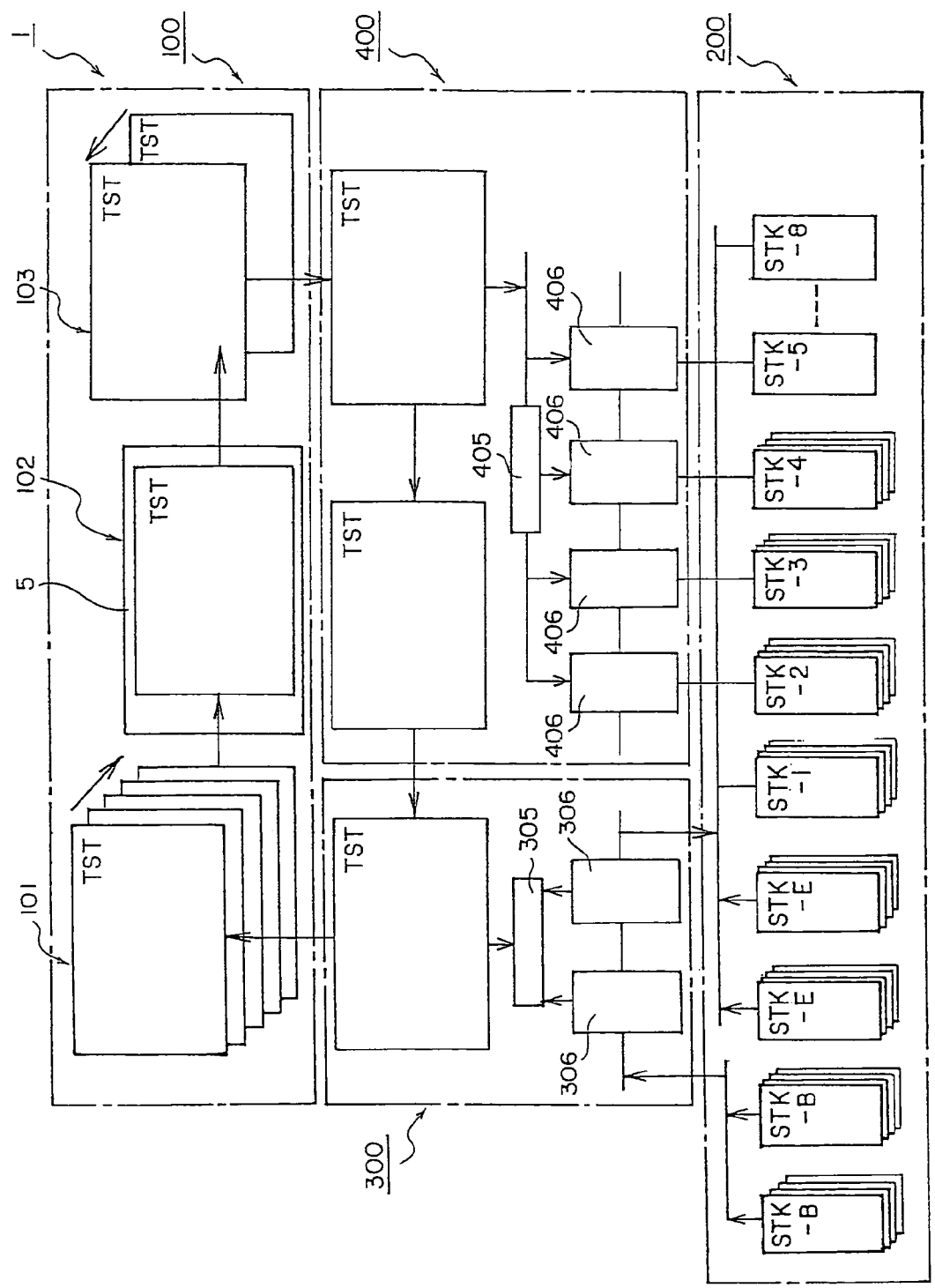
FIG. 3 is a flow chart of a tray, illustrating a rotation method for a test subject IC device.
Figure 6:
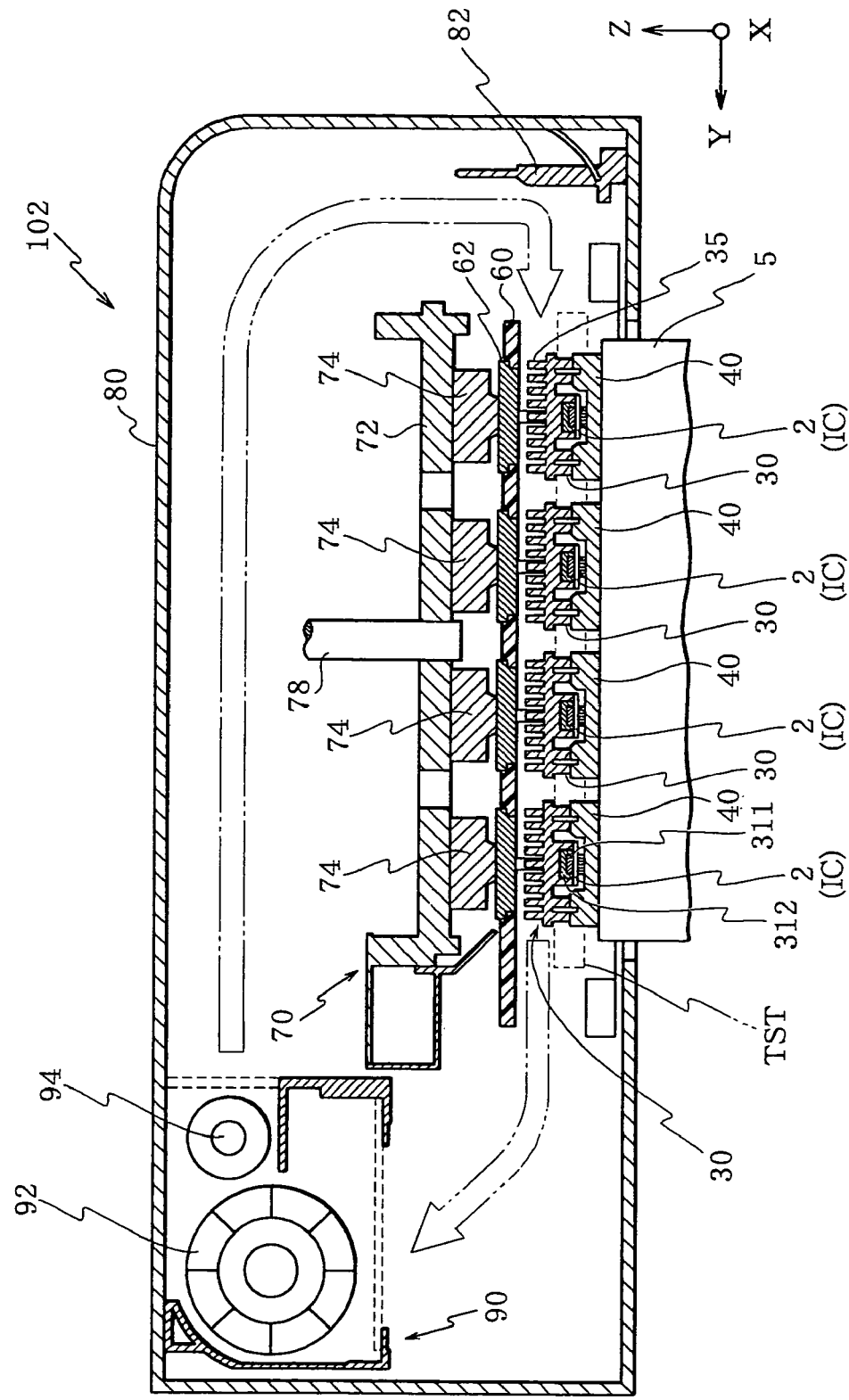
FIG. 6 is a cross section of the main part inside a test chamber of the above handler.

The handler 1 is an apparatus for testing IC devices which serve as electronic components subject to testing in higher temperature conditions (high temperature) or lower temperature conditions (low temperature) than normal temperature. As shown in FIGS. 2 and 3, the handler 1 is provided with a chamber section 100 which is constituted by a thermostatic chamber 101, a test chamber 102, and a heat-removing chamber 103. As shown in FIG. 6, the upper portion of the test head 5 shown in FIG. 1 is inserted into the interior of the test chamber 102 so that the IC devices 2 can be tested.

It should be noted that FIG. 3 is a drawing for the purpose of understanding the rotation method of the test subject IC devices in the handler of this embodiment, and members which in actuality are disposed in a vertical direction are illustrated two-dimensionally therein. Accordingly, the mechanical (three-dimensional) configuration may be understood primarily with reference to FIG. 2.

As shown in FIGS. 2 and 3, the handler 1 of this embodiment is constituted by an IC storing section 200 for storing the IC devices which are to be further tested or for classifying and storing the IC devices which have been tested, a loader section 300 for transmitting test subject IC devices which are sent from the IC storing section 200 to a chamber section 100, the chamber section 100 which contains the test head, and an unloader section 400 for retrieving and classifying ICs which have been tested in the chamber section 100. In the interior of the handler 1, IC devices are transported being housed in test trays.

Figure 5:
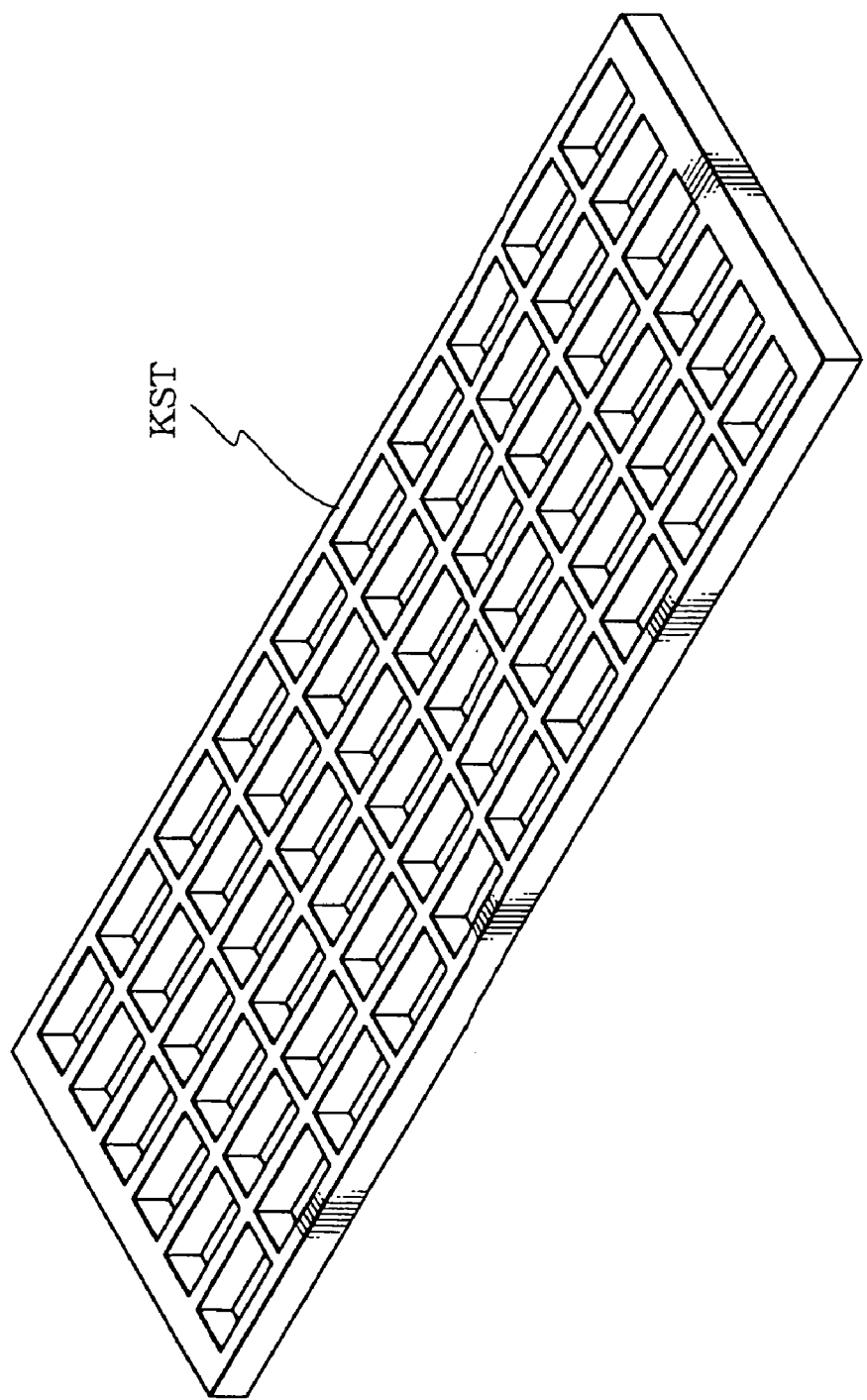
FIG. 5 is a perspective view illustrating a customer tray used in the above handler.

Prior to being set in the handler 1, IC devices are housed in a plurality in a customer tray KST as shown in FIG. 5, and are supplied in this state to the IC storing section 200 of the handler 1 shown in FIGS. 2 and 3. The IC devices 2 are then loaded from the customer tray KST onto a test tray TST (see FIG. 7) which is handled in the handler 1. As shown in FIG. 3, in the interior of the handler 1 the IC devices are moved while loaded on the test tray TST and are thus supplied with high temperature or low temperature thermal stress, tested (checked) for appropriate operations, and classified according to the results of this test. The individual parts of the interior of the handler 1 will be described in detail below.

Firstly, parts relating to the IC storing section 200 will be described.

As shown in FIG. 2, the IC storing section 200 is provided with pre-test IC stockers 201 for storing IC devices prior to testing, and post-test IC stockers 202 for storing IC devices which have been classified according to the test results.

Figure 4:
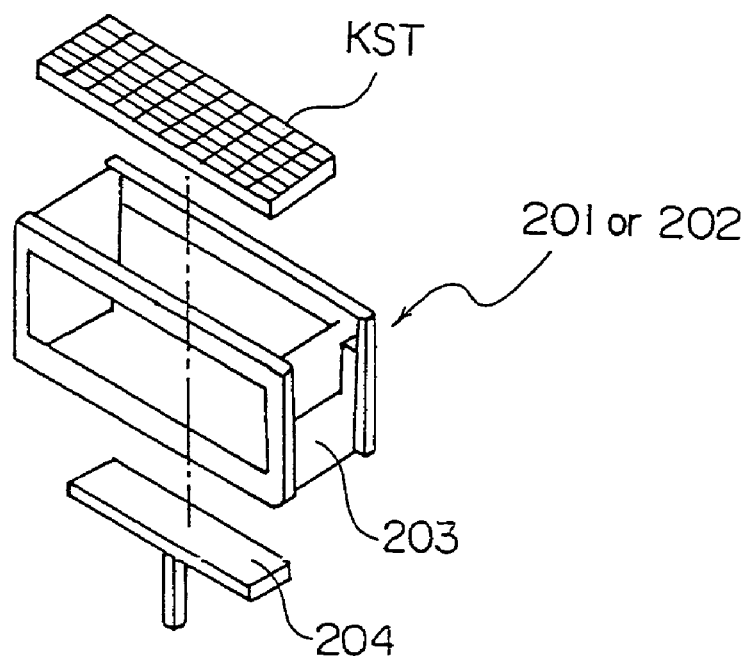
FIG. 4 is a perspective view illustrating the constitution of an IC stocker in the above handler.

As shown in FIG. 4, these pre-test IC stockers 201 and post-test IC stockers 202 comprise a frame-form tray support frame 203 and an elevator 204 which penetrates the tray support frame 203 from the lower portion thereof and is capable of rising toward the upper portion thereof. A plurality of customer trays KST are accumulated on and supported by the tray support frame 203, and only these accumulated customer trays KST are moved up and down by the elevator 204. Note that in this embodiment, the customer tray KST is provided with 10 rows×6 columns of IC device storage portions, as is shown in FIG. 5.

Customer trays KST housing test subject IC devices are accumulated and supported in the pre-test IC stockers 201 shown in FIG. 2. Customer trays KST housing tested and classified IC devices are accumulated and supported in the post-test IC stockers 202.

Note that these pre-test IC stockers 201 and post-test IC stockers 202 have substantially identical constitutions and therefore the parts of the pre-test IC stockers 201 may be used as post-test IC stockers 202 and vice versa. Accordingly, the number of pre-test IC stockers 201 and the number of post-test IC stockers 202 may be easily modified according to necessity.

As shown in FIGS. 2 and 3, in this embodiment two stockers STK-B are provided as pre-test IC stockers 201. Two empty stockers STK-E which are transported to the unloader section 400 as post-test IC stockers 202 are provided adjacent to the stockers STK-B. Eight stockers STK-1, STK-2, . . . , STK-8 are provided adjacent thereto as post-test IC stockers 202, and thus IC devices can be sorted into a maximum of eight classifications according to the test results and stored. That is, not only can IC devices be classified as good or defective, but the good IC devices can be sorted into those with a high operating speed, those with an intermediate operating speed, and those with a low operating speed, and the defective IC devices can be sorted into those which require re-testing and so on.

Secondly, parts relating to the loader section 300 will be described.

As shown in FIG. 2, the customer trays KST stored in the tray support frame 203 of the pre-test IC stockers 201 shown in FIG. 4 are transported from the lower side of an apparatus substrate 105 to window portions 306 in the loader section 300 by a tray transferring arm 205 which is provided between the IC storing section 200 and the apparatus substrate 105. Then, in the loader section 300, the test subject IC devices which are loaded in the customer trays KST are transferred to a preciser 305 by an X-Y transporting apparatus 304, and after the mutual positions of the test subject IC devices have been corrected, the X-Y transporting apparatus 304 is used again to reload the test subject IC devices transferred to the preciser 305 into a stationary test tray TST in the loader section 300.

As shown in FIG. 2, the X-Y transporting apparatus 304 which loads the test subject IC devices from the customer tray KST into the test tray TST comprises two rails 301 which hang over the apparatus substrate 105, a movable arm 302 which by means of the two rails 301 is capable of performing a reciprocal motion between the test tray TST and customer tray KST (the direction of which will be referred to as the Y direction), and a movable head 303 which is supported by the movable arm 302 and is capable of moving in the X direction along the movable arm 302.

A suction head is attached downwardly to the movable head 303 of the X-Y transporting apparatus 304, and this suction head sucks up a test subject IC device from the customer tray KST by moving while sucking air, and then loads the test subject IC device into the test tray TST. Up to eight of these suction heads, for example, are attached to the movable head 303, and thus eight test subject IC devices can be loaded into the test tray TST at one time.

Thirdly, parts relating to the chamber section 100 will be described.

The test tray TST described above is transferred to the chamber section 100 following loading of the test subject IC devices by the loader section 300, and thus each of the test subject IC devices which are loaded on the test tray TST are tested.

As shown in FIGS. 2 and 3, the chamber section 100 is constituted by a thermostatic chamber 101 for providing a target high-temperature or low-temperature thermal stress to the test subject IC devices which are loaded into the test tray TST, a test chamber 102 in which the test subject IC devices to which thermal stress has been applied by the thermostatic chamber 101 are attached to the socket on the test head, and a heat-removing chamber 103 for removing the applied thermal stress from the test subject IC devices which have been tested in the test chamber 102.

When a high temperature has been applied in the thermostatic chamber 101, the test subject IC devices are cooled back to room temperature in the heat-removing chamber 103 by air blasting, and when a low temperature has been applied in the thermostatic chamber 101, the test subject IC devices are heated by warm air, a heater, or the like to a sufficient temperature for preventing the formation of condensation. The heat-removed test subject IC devices are then transported to the unloader section 400.

As shown in FIG. 2, the thermostatic chamber 101 and heat-removing chamber 103 of the chamber section 100 are disposed so as to protrude upward from the test chamber 102. As is shown in outline in FIG. 3, the thermostatic chamber 101 is provided with a perpendicular transporting apparatus on which a plurality of test trays TST are supported while waiting for the test chamber 102 to become available. During the majority of this waiting period, high-temperature or low-temperature thermal stress is applied to the test subject IC devices.

Figure 7:
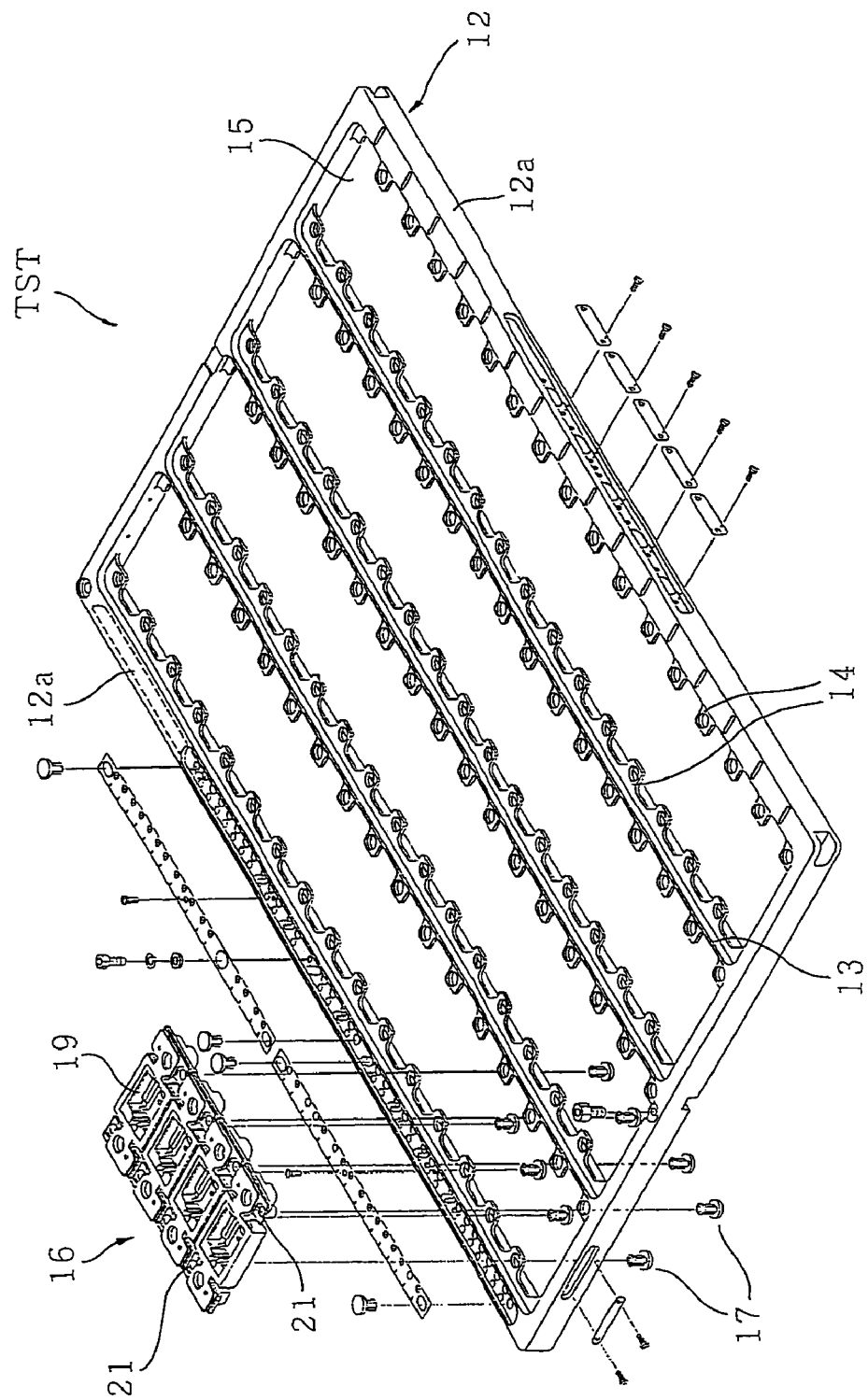
FIG. 7 is a partially exploded perspective view illustrating a test tray used in the above handler.

As shown in FIG. 6, the test head 5 is disposed in the central lower portion of the test chamber 102, and the test trays TST are carried onto the test head 5. All of the IC devices 2 which are supported by the test trays TST shown in FIG. 7 are then successively caused to electrically contact the test head 5 such that tests are performed on all of the IC devices 2 on the test trays TST. On the other hand, the test trays TST that have already been subjected to the test are subjected to thermal stress relieving in the heat-removing chamber 103, and after the temperature of IC devices 2 has returned to room temperature, the devices 2 are discharged into the unloader section 400 shown in FIG. 2 and FIG. 3.

Further, as shown in FIG. 2, an inlet opening portion for allowing the test trays TST to enter from the apparatus substrate 105 and an outlet opening portion for allowing the test trays TST to exit to the apparatus substrate 105 are formed in the upper portion of the thermostatic chamber 101 and heat-removing chamber 103 respectively. Test tray transporting apparatus 108 for ejecting and retracting the test trays TST from the opening portion are provided on the apparatus substrate 105. These transporting apparatus 108 are constituted by a rotary roller or the like, for example. Test trays TST discharged from the heat-removing chamber 103 are transported to the unloader section 400 by the test tray transporting apparatus 108 provided on the apparatus substrate 105.

FIG. 7 is an exploded perspective view showing the constitution of the test tray TST used in this embodiment. This test tray TST has a rectangular frame 12 and a plurality of crosspieces 13 which are provided on this frame 12 in parallel and at equal intervals. A plurality of attachment pieces 14 are formed so as to protrude at equal intervals in a longitudinal direction on both sides of the crosspieces 13 and inside edges 12a of the frame 12 parallel to the crosspieces 13. Respective insert housing parts 15 are composed by those pairs of attachment pieces 14 that face each other of the plurality of attachment pieces 14 provided between those crosspieces 13 and between the crosspieces 13 and sides 12a.

One insert 16 is housed in each insert housing part 15, and this insert 16 is attached to two attachment pieces 14 in a floating state using fasteners 17. In this embodiment, 4×16 inserts 16 are attached to one test tray TST. In other words, the test tray TST in this embodiment is provided with 4 columns×16 rows of IC device housing parts. The test subject IC devices 2 are loaded into the test trays TST as a result of the test subject IC devices 2 being housed in these inserts 16.

Figure 8:
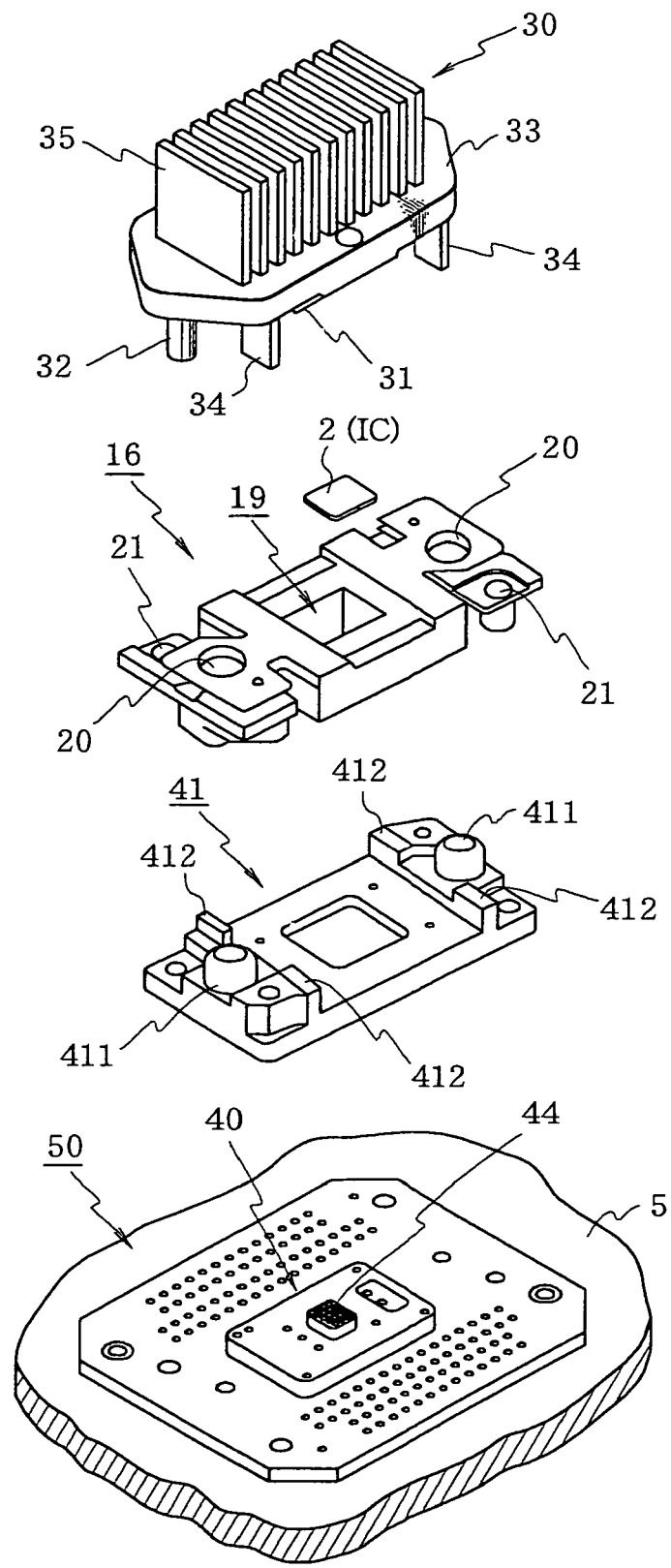
FIG. 8 is an exploded perspective view illustrating a configuration in the vicinity of a socket on the test head of the above handler.

As shown in FIGS. 7 and 8, a rectangular concave IC housing part 19 for housing a test subject IC device 2 is formed in the center of the insert 16 in this embodiment. Further, guide holes 20 into which guide pins 32 of a pusher 30 are inserted are formed in the center of the two ends of the insert 16, and attachment holes 21 for attaching to the attachment pieces 14 of the test tray TST are formed in a corner portion of each end of the insert 16.

As shown in FIG. 8, a socket board 50 is disposed on the test head 5, and a socket 40 having probe pins 44 which serve as connection terminals is fixed thereon. The probe pins 44 are provided in a number and pitch corresponding to the connection terminals of the IC device 2 and an upward force is imparted thereto with a spring, not shown in the figure.

Figure 9:
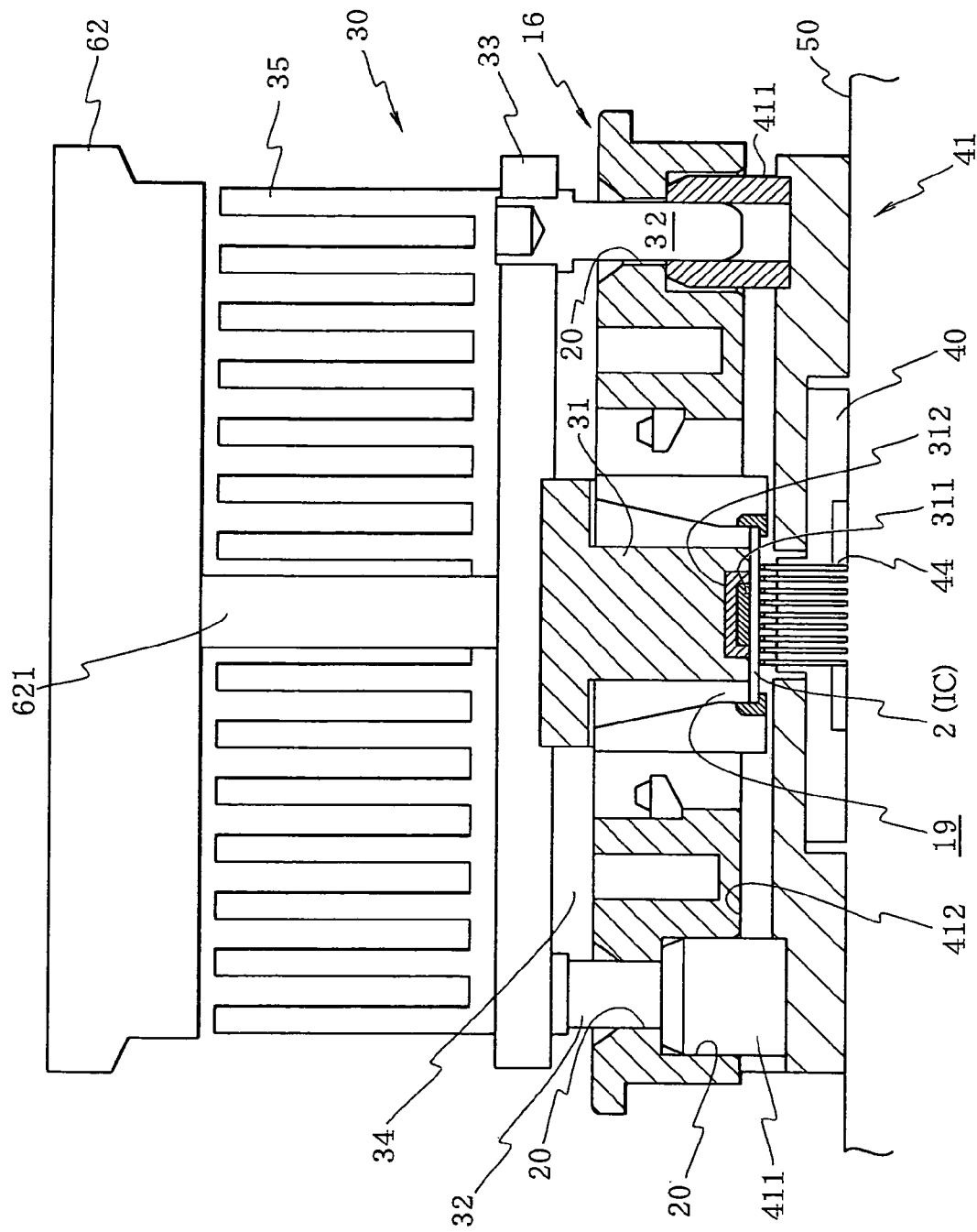
FIG. 9 is a cross section of the vicinity of a pusher (when lowered) in the above handler.

Also as shown in FIGS. 8 and 9, a socket guide 41 is fixed onto the socket board 50 such that the probe pins 44 provided on the socket 40 are exposed. Guide bushes 411 for inserting the two guide pins 32 formed in the pusher 30 and positioning the two guide pins 32 with respect to each other are provided on both sides of socket guide 41.

As shown in FIGS. 6 and 8, pushers 30 are provided in a number corresponding to the sockets 40 on the upper side of the test head 5. As shown in FIGS. 8 and 9, the pushers 30 are provided with a pusher base 33 which is fixed to a rod 621 of an adapter 62 to be described hereinafter. A pushing member 31 for pushing the test subject IC devices 2 is provided facing downward in the center of the lower side of this pusher base 33, and the guide pins 32 which are inserted into the guide holes 20 of the insert 16 and the guide bushes 411 of the socket guide 41 are provided on both ends of the lower side of the pusher base 33. Further, stopper pins 34 which, when the pusher 30 is moved downward by a Z axis driving apparatus 70, are capable of defining the lower limit of this movement by contacting a stopper surface 412 of the socket guide 41 are provided between the pushing member 31 and guide pins 32.

As shown in FIGS. 6 and 9, a heater 311 is provided in the lower portion of the pushing member 31 of the pusher 30 so as to be exposed on the same plane as the lower surface of the pushing member 31, and a thermal insulating material 312 is provided between this heater 311 and the pushing member 31.

There are no particular limitations on the type of heater 311 as long as it is capable of controlling the test subject IC devices 2 to a predetermined test temperature. The temperature of the generated heat or ON/OFF of heat generation in this heater 311 is controlled by an output signal from a control apparatus not shown in the drawings.

There are also no particular limitations on the thermal insulating material 312 as long as it is capable of increasing the thermal resistance between the pushing member 31 of the pusher 30 and the heater 311 beyond the thermal resistance between the heater 311 and the test subject IC devices 2, preferably at least threefold or fourfold. For example, a material having glass fiber laminated in a resin such as silicone based resin or epoxy based resin, a rubber based material such as silicone rubber, or another material may be used as this thermal insulating material 312.

A heat sink 35 (which corresponds to the heat absorbing and radiating body of the present invention) is provided on the upper side of the pusher base 33. This heat sink 35 is constituted by a plurality of radiator fins which are constructed from a material having good thermal conductivity such as aluminum, copper, an alloy thereof, a carbon based material, or the like. The pusher base 33 and pushing member 31 are likewise constructed from a metal having good thermal conductivity such as aluminum, copper, an alloy thereof (including stainless steel), or the like, and thus the heat of the test subject IC devices 2 during testing is conducted from the pushing member 31 contacting the test subject IC devices 2 to the heat sink 35 via the pusher base 33, whereby this heat can be radiated in the environment from the heat sink 35. Note that the heat sink 35 may be constituted by heat pipes rather than radiator fins.

As shown in FIG. 9, rods 621 (two) are provided facing downward on the adapter 62, and the pusher base 33 of the pusher 30 is supported and fixed by these rods 621. As shown in FIG. 6, each adapter 62 is elastically supported on a match plate 60, and the match plate 60 is provided in a position above the test head 5 such that the test trays TST may be inserted between the pusher 30 and socket 40. The pushers 30 which are supported on the match plate 60 are movable in the Z axis direction in relation to the test head 5 or a driving plate (driving body) 72 of the Z axis driving apparatus 70. Note that the test trays TST are transported between the pusher 30 and socket 40 from a perpendicular direction to the paper surface of FIG. 6 (the X axis). Transportation rollers or the like are used as test tray TST transporting means in the interior of the chamber section 100. When the test trays TST are to be transported, the driving plate of the Z axis driving apparatus 70 rises in the Z axis direction such that a sufficient clearance is formed between the pusher 30 and socket 40 for inserting the test trays TST.

As shown in FIG. 6, pressure members 74 are fixed to the bottom face of the driving plate 72 so as to be capable of pushing down the upper face of the adapters 62 which are supported on the match plate 60. A driving shaft 78 is fixed to the driving plate 72 and a driving source (not shown) such as a motor is connected to the driving shaft 78 to enable the driving shaft 78 to move up and down in the Z axis direction and thereby push down the adapters 62.

The match plate 60 has a structure that can be replaced, together with the adapter 62 and pusher 30, according to the shape of the test subject IC devices 2 and the number of sockets on the test head 5 (the number of IC devices 2 that are to be tested at the same time). Thus, providing a replaceable match plate 60 makes it possible to use the Z axis driving apparatus 70 designed for general applications.

In the chamber section 100 of this embodiment, constituted as described above, a temperature adjusting air blower 90 is attached to the interior of sealed casing 80 which constitutes the test chamber 102, as shown in FIG. 6. The temperature adjusting air blower 90 is provided with a fan 92 and a heat exchange unit 94. Air inside the casing is sucked by the fan 92 and circulated by discharging into the casing 80 via the heat exchange unit 94, and thus the interior of the casing 80 is set to predetermined temperature conditions (high temperature or low temperature).

When the casing interior is to be set to high temperature, the heat exchange unit 94 of the temperature adjusting air blower 90 is constituted by a radiation heat exchanger through which a heating medium circulates, an electric heater, or another similar object, and is thus capable of providing a sufficient amount of heat to maintain the casing interior at a high temperature of room temperature up to 160° C., for example. When the casing interior is to be set at a low temperature, the heat exchange unit 94 is constituted by a thermal absorption heat exchanger or the like through which a refrigerant such as liquid nitrogen circulates, and is thus capable of absorbing sufficient heat to maintain the casing interior at a low temperature of −60° C. up to room temperature, for example. The internal temperature of the casing 80 is detected by a temperature sensor 82, for example, and thus the amount of air from the fan 92 and the amount of heat from the heat exchange unit 94 and so on are controlled such that the interior of the casing 80 is maintained at a predetermined temperature.

The warm air or cold blast (air) generated through the heat exchange unit 94 of the temperature adjusting air blower 90 circulates through the interior of the casing by flowing in the Y axis direction in the upper portion of the casing 80, dropping down the casing side wall opposite to the air blower 90, passing through the gap between the match plate 60 and the test head 5, and then returning to the air blower 90.

Fourthly, parts relating to the unloader section 400 will be described.

X-Y transporting apparatus 404, 404 with an identical constitution to the X-Y transporting apparatus 304 provided in the loader section 300 are also provided in the unloader section 400 shown in FIGS. 2 and 3, and by means of these X-Y transporting apparatus 404, 404, tested IC devices are loaded onto customer trays KST from the test trays TST transported to the unloader section 400.

As shown in FIG. 2, two pairs of windows 406, 406 disposed so as to face the customer tray KST carried to the unloader section 400 on the upper surface of apparatus substrate 105 are provided in an open condition in the apparatus substrate 105 of unloader section 400.

An elevator 204 is provided below each window 406 for lifting the customer trays KST (see FIG. 4). Here, customer trays KST which are fully loaded with tested IC devices are lowered, and these full trays are transferred to the tray transferring arm 205.

Next, a method for testing an IC device 2 in the IC device testing apparatus 10 described above while controlling the temperature of the IC device 2 will be described.

The IC device 2 loaded onto the test tray TST shown in FIG. 7, or more specifically the individual IC devices 2 dropped into the IC housing parts 19 of the inserts 16 in FIG. 7, is heated to a predetermined set temperature in the thermostatic chamber 101 and then transported into the test chamber 102.

The test tray TST carrying the IC device 2 is then halted on the test head 5, whereupon the Z axis driving apparatus is driven such that the pressure member 74 which is fixed to the driving plate 72 pushes the pusher base 33 of the pusher 30 via the rods 621 of the adapters 62. As a result, the pushing member 31 of the pusher 30 pushes the main package body of the IC device 2 into the socket 40, and thus the connection terminals of the IC device 2 are connected to the probe pins 44 of the socket 40.

Note that the downward movement of the pusher 30 is limited by the stopper pins 34 of the pusher 30 contacting the stopper surface 412 of the socket guide 41, and thus the pusher 30 is able to push the IC device 2 into the socket 40 with an appropriate pressure at which the IC device 2 does not break.

In this state, a testing electric signal is transmitted from the main testing apparatus 6 to the test subject IC device 2 via the probe pins 44 in the test head 5, whereupon the test is performed. At this time, if the temperature of the pusher 30, which has been on standby near the center of the test chamber 102, is higher than the predetermined set temperature, the heat sink 35 provided in the pusher 30 absorbs and radiates the heat in the pusher 30 (heat absorption and radiation), and thus the temperature of the test subject IC device 2 which is pushed by the pusher 30 can be prevented from rising excessively above the set temperature.

Further, if the socket 40, which tends to let the heat inside the test chamber 102 escape, is lower than the predetermined set temperature, by generating heat in the heater 311, the test subject IC device 2 which contacts the heater 311 can be heated so as to near the set temperature.

If the test subject IC device 2 has reached a higher temperature than the set temperature due to self-induced heat generation, the heat in the test subject IC device 2 is transferred from the pushing member 31 of the pusher 30 to the heat sink 35 via the pusher base 33 and radiated out from the heat sink 35. Here, thermal insulating material 312 is provided between the heat sink 35 and the heater 311 such that the heat sink 35 can be prevented from being warmed by the heat of the heater 311, and thus heat can be radiated out from the heat sink 35 effectively. In this manner, excessive temperature rises in the test subject IC device 2 can be prevented even when the test subject IC device 2 reaches a higher temperature than the set temperature due to self-induced heat generation, and hence the test subject IC device 2 can be controlled to a temperature in the vicinity of the set temperature.

Note that temperature control (ON/OFF) of the heater 311 may be performed in accordance with temperature changes in the test subject IC device 2 according to a test pattern, and the degree of heat radiation from the heat sink 35 maybe controlled by the temperature, amount and so on of the air which circulates through the test chamber 102.

Figure 10:
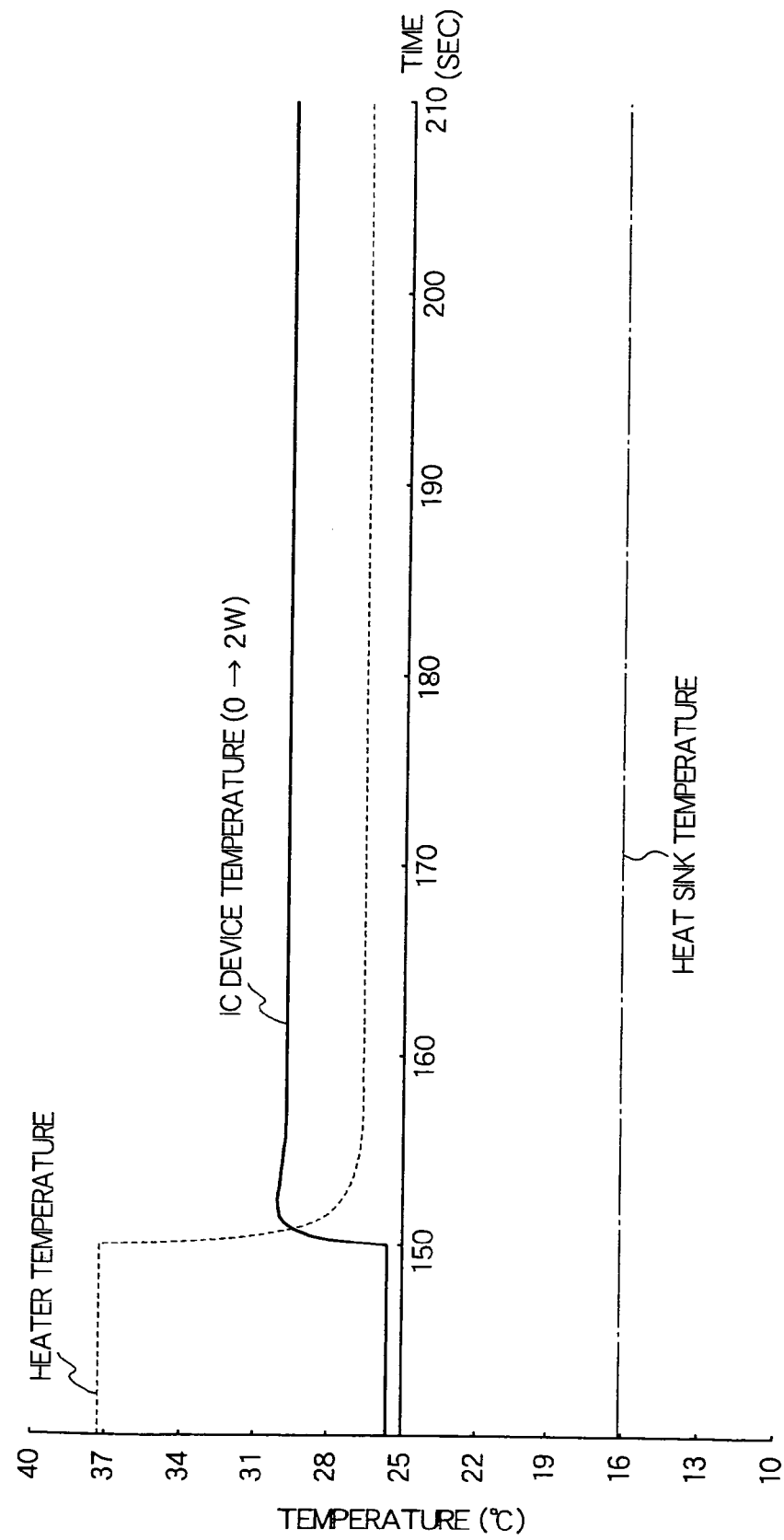
FIG. 10 is a graph of a simulation performed when heat is generated in a test subject IC device in the above handler from 0 W to 2 W.
Figure 11:
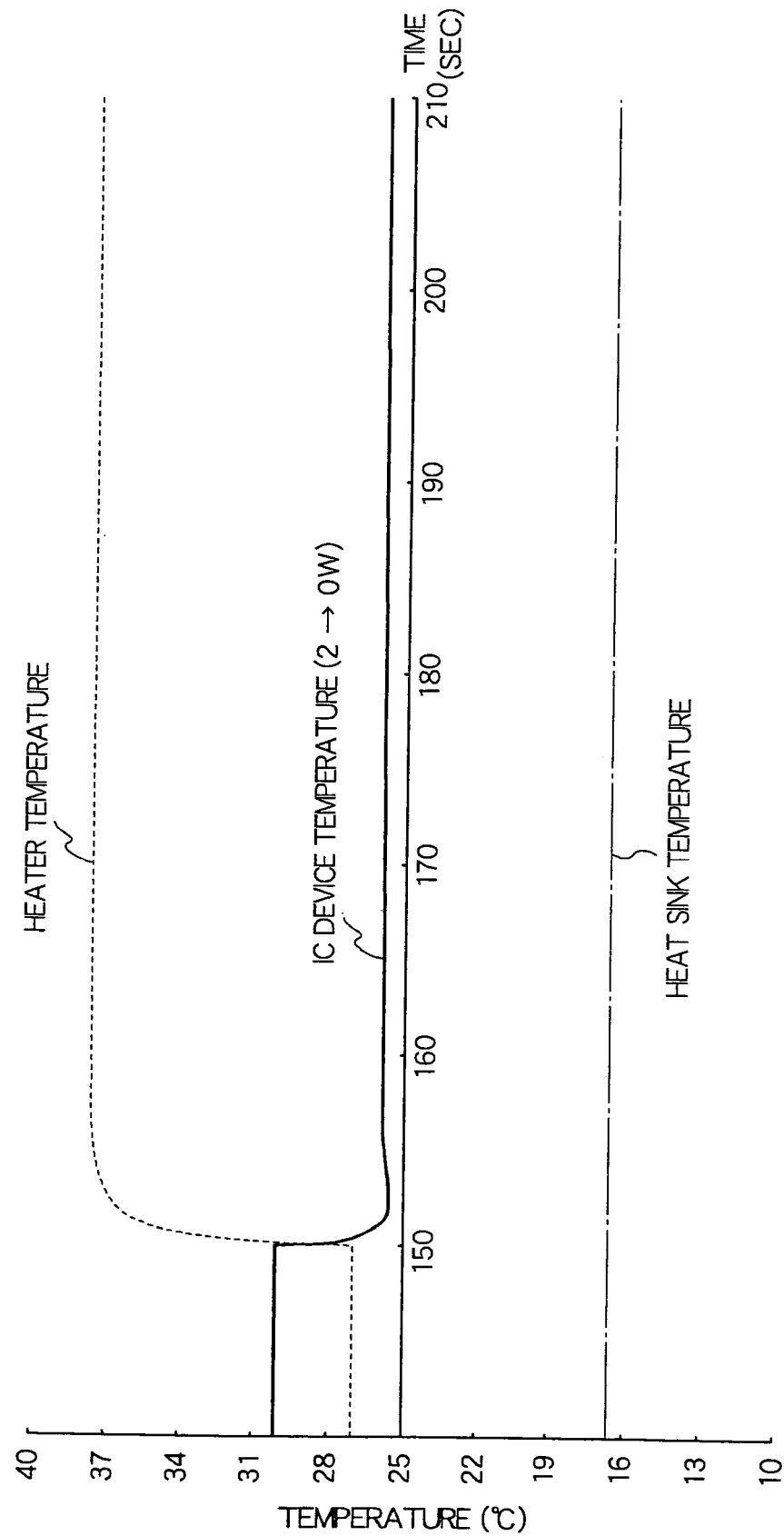
FIG. 11 is a graph of a simulation performed when the test subject IC device 2 in the above handler is reduced from a heated state of 2 W to 0 W.

A simulation of the temperature changes in the test subject IC device 2, heater 311, and heat sink 35 in the IC device test apparatus 10 provided with the handler 1 according to this embodiment is performed. A graph of a simulation in which heat generation is performed in the test subject IC device 2 from 0 W to 2 W is shown in FIG. 10, and a graph of a simulation in which the heat generation state of the test subject IC device 2 is reduced from 2 W to 0 W is shown in FIG. 11. Note that in this simulation, it is assumed that the set temperature of the test is 25° C. and the temperature of the air which circulates through the test chamber 102 is 12° C.

[IC device: 0 W→2 W]

As shown in FIG. 10, the temperature of the IC device 2, which was approximately 26° C., rises to approximately 30° C. at the point of heat generation in the IC device 2 (after 150 seconds), and after five seconds falls to approximately 29° C., at which it is substantially maintained. From an ON state of approximately 37.5° C., the heater 311 is switched OFF in accordance with the heat generation in the IC device 2 (after 150 seconds) and falls to a temperature of approximately 26.5° C. The heat sink 35 is substantially maintained at approximately 16° C.

[IC device: 2 W→0 W]

As shown in FIG. 11, the temperature of the IC device 2, which was approximately 30° C., falls to 25.5° C. when the IC device 2 reaches 0 W (after 150 seconds), and after approximately five seconds rises to approximately 26° C. at which it is substantially maintained. From an OFF state of approximately 27° C., the heater 311 is switched ON in accordance with the IC device 2 reaching 0 W (after 150 seconds) and rises to a temperature of approximately 37° C. The temperature of the heat sink 35 gradually falls from approximately 17° C. to approximately 16.5° C.

Figure 12:
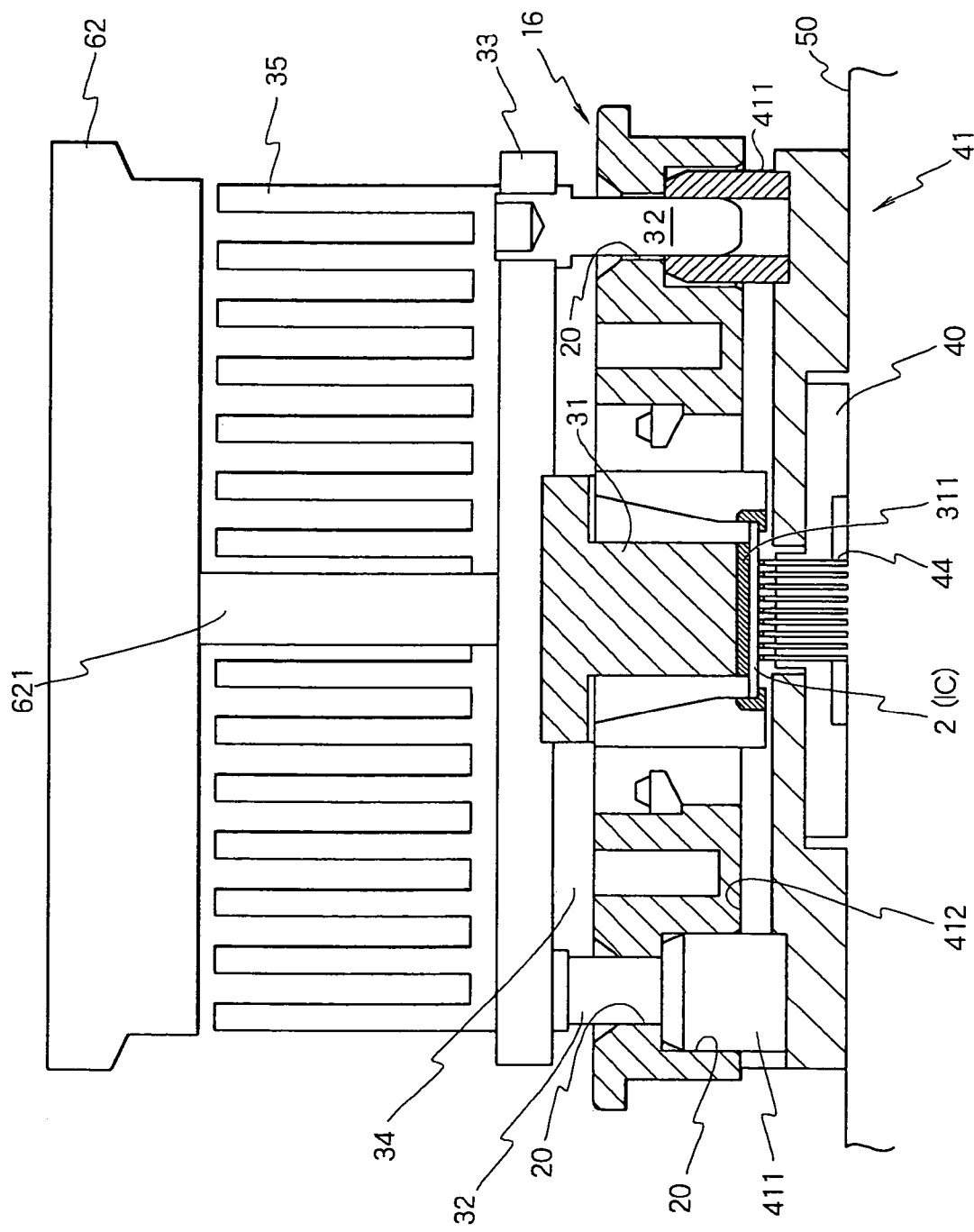
FIG. 12 is a cross section of the vicinity of a pusher (when lowered) in a handler used for comparison.
Figure 13:
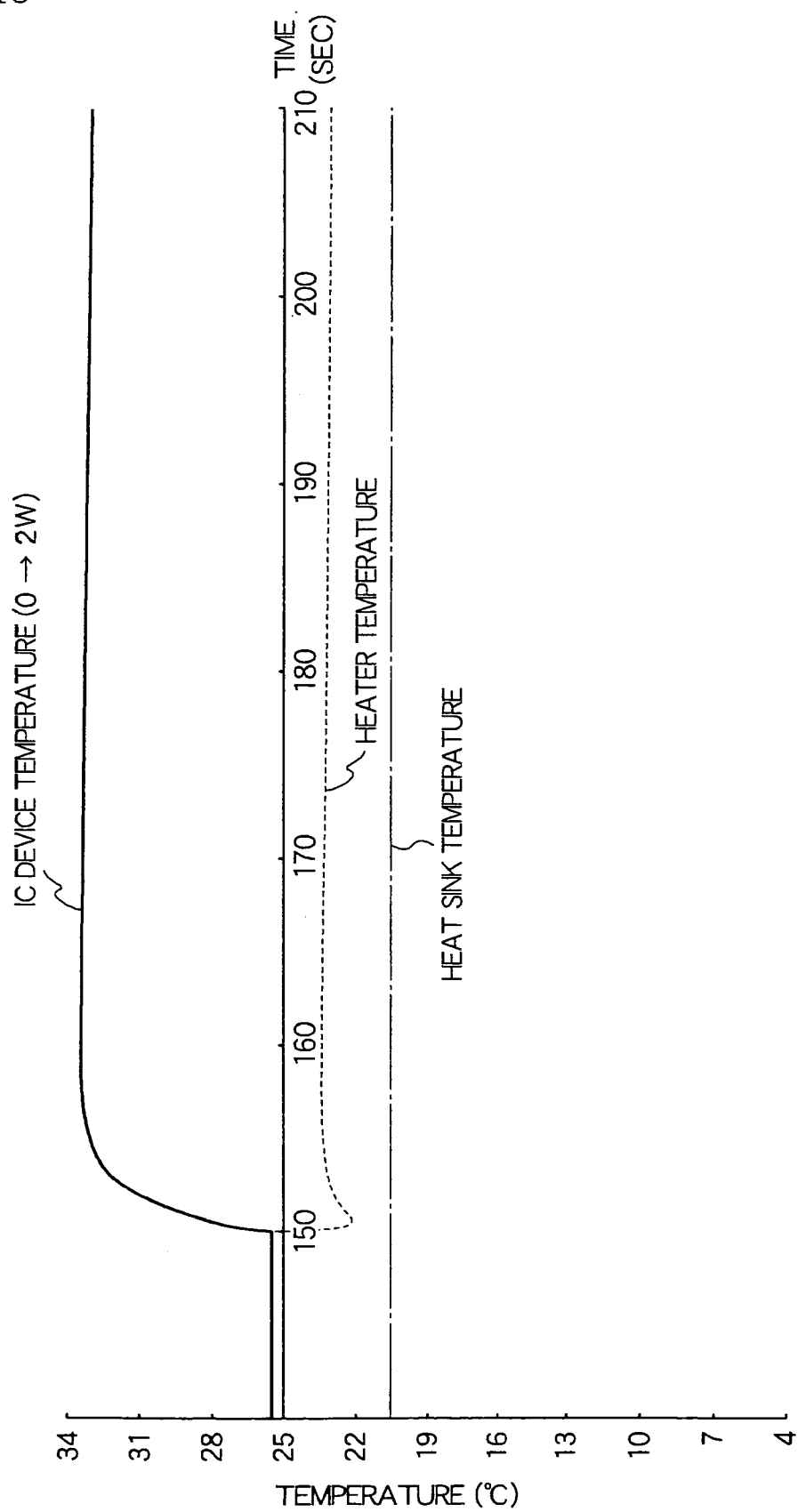
FIG. 13 is a graph of a simulation performed when heat is generated in a test subject IC device in the above handler from 0 W to 2 W.
Figure 14:
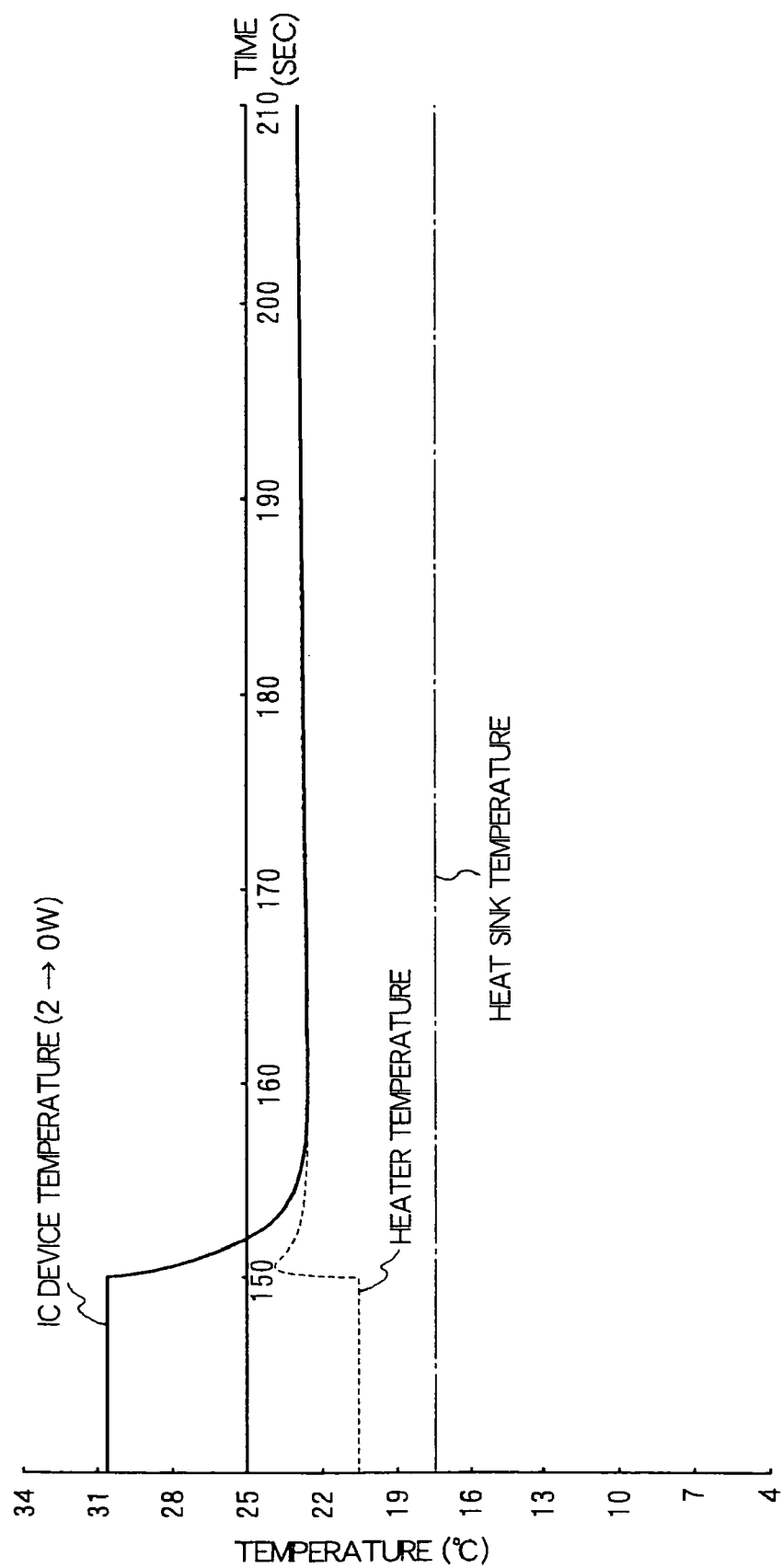
FIG. 14 is a graph of a simulation performed when the test subject IC device 2 in the above handler is reduced from a heated state of 2 W to 0 W.

As a comparison, a simulation of the temperature changes in the test subject IC device 2, heater 311, and heat sink 35 is performed with the heater 311 attached to the entire lower surface of the pushing member 31 of the pusher 30, as is shown in FIG. 12. A graph of a simulation in which heat generation is performed in the test subject IC device 2 from 0 W to 2 W is shown in FIG. 13, and a graph of a simulation in which the heat generation state of the test subject IC device 2 is reduced from 2 W to 0 W is shown in FIG. 14. Note that in this simulation, it is assumed that the set temperature of the test is 25° C. and the temperature of the air which circulates through the test chamber 102 is 13° C.

[IC device: 0 W→2 W]

As shown in FIG. 13, the temperature of the IC device 2, which was approximately 26° C., rises to approximately 33° C. at the point of heat generation in the IC device 2 (after 150 seconds), and then gradually falls to approximately 32.5° C. From an ON state of approximately 26° C., the heater 311 is switched OFF in accordance with the heat generation in the IC device 2 (after 150 seconds) and falls to a temperature of approximately 22° C. The heater 311 then rises to approximately 23.5° C. and then gradually falls to approximately 23° C. The temperature of the heat sink 35 gradually falls from approximately 20.5° C. to approximately 20° C.

[IC device: 2 W→0 W]

As shown in FIG. 14, the temperature of the IC device 2, which was approximately 30.5° C., falls to 22.5° C. when the IC device 2 reaches 0 W (after 150 seconds), and thereafter gradually rises to approximately 23° C. From an OFF state of approximately 20.5° C., the heater 311 is switched ON in accordance with the IC device 2 reaching 0 W (after 150 seconds) and rises to a temperature of approximately 24° C. The heater 311 then falls to approximately 22.5° C. and then gradually rises to approximately 23° C. The temperature of the heat sink 35 gradually rises from approximately 17.5° C. to approximately 18° C.

Thus in the comparative embodiment, temperature change in the test subject IC device 2 is approximately 8° C. on the plus side of the set temperature, and approximately 2.5° C. on the minus side of the set temperature, whereas in the embodiment according to the present invention, temperature change in the test subject IC device 2 can be suppressed to approximately 5° C. on the plus side of the set temperature. As a result, the IC device 2 can be tested accurately, thereby improving yield.

The embodiment described above has been described for the purpose of facilitating understanding of the present invention, but not to limit the present invention. Accordingly, each of the elements disclosed in the aforementioned embodiment is intended to include all design modifications and equivalent items within the technical scope of the present invention.

For example, temperature control of the heat sink 35 may be performed using Z axis direction air by providing a through hole in the match plate 60 and allowing the air circulating through the test chamber 102 to pass through this through hole. Further, in order to facilitate the flow of air through the test chamber 102, the disposal direction of the radiator fins of the heat sink 35 may be altered by 90° from this embodiment or may be stacked in a longitudinal direction. Moreover, a heat transfer plate (made from metal, resin, carbon based material or the like) through which heat is easily transferred in the direction of thickness but not easily transferred in the planar direction may be provided on the lower end of the pushing member 31 of the pusher 30.

INDUSTRIAL APPLICABILITY

As described above, according to the present invention temperature control can be performed on an electronic component such that the electronic component nears a target set temperature for a test. In other words, the heater-equipped pusher, electronic component handling apparatus, and electronic component temperature control method in accordance with the present invention are effective for performing tests in which accurate temperature control of an electronic component is required.

What is claimed is:

1. A heater-equipped pusher for pushing a terminal of an electronic component to be tested in an electronic component handling apparatus into a contact portion of a test head, comprising:
    a pusher main body which is capable of direct contact with the electronic component to be tested;
    a heat absorbing and radiating body provided on said pusher main body;
    a heater provided on said pusher main body to enable direct or indirect contact with the electronic component to be tested without intervention of said pusher main body; and
    a thermal insulating material provided between said pusher main body and said heater,
    wherein the heater is disposed on a lower portion of the pusher main body so as to be exposed on a same plane as a lower surface of the pusher main body.

2. A heater-equipped pusher for pushing a terminal of an electronic component to be tested in an electronic component handling apparatus into a contact portion of a test head, comprising:
    a pusher main body which is capable of direct contact with the electronic component to be tested;
    a heat absorbing and radiating body provided on said pusher main body;
    a heater provided on said pusher main body to enable direct or indirect contact with the electronic component to be tested without intervention of said pusher main body; and
    a thermal insulating material provided between said pusher main body and said heater,
    wherein the heat absorbing and radiating body is a heat sink.

3. The heater-equipped pusher of claim 2, wherein the heat sink includes a plurality of radiator fins.

4. The heater-equipped pusher of claim 2, wherein the heat sink includes a plurality of heat pipes.

5. A temperature control method for controlling the temperature of an electronic component to be tested during the testing of the electronic component in an electronic component handling apparatus, comprising:
    cooling of the electronic component to be tested, performed by cooling a heat absorbing and radiating body to which the heat of the electronic component is transferred through a pusher main body, the pusher main body being in contact with the electronic component; and heating of the electronic component to be tested, performed by a heater, and preventing heat conduction from the heater to the pusher main body and the heat absorbing and radiating body by a thermal insulating material provided between the pusher main body and the heater, wherein the heater is disposed on a lower portion of the pusher main body so as to be exposed on a same plane as a lower surface of the pusher main body.

* * * * *

UNITED STATES PATENT AND TRADEMARK OFFICE
CERTIFICATE OF CORRECTION

PATENT NO.         : 7,049,841 B2
APPLICATION NO. : 10/729975
DATED                 : December 9, 2003
INVENTOR(S)       : Tsuyoshi Yamashita It is certified that error appears in the above-identified patent and that said Letters Patent is hereby corrected as shown below:

On Title Page, col. 1 Item (65)

Prior Publication Data

Correct the domestic priority claim information to include:

This application is a CON of PCT/JP02/06815 filed on 07/04/2002

Signed and Sealed this

Twenty-second Day of August, 2006

JON W. DUDAS
*Director of the United States Patent and Trademark Office*

UNITED STATES PATENT AND TRADEMARK OFFICE
CERTIFICATE OF CORRECTION

| | |
|---|---|
| PATENT NO. | : 7,049,841 B2 |
| APPLICATION NO. | : 10/729975 |
| DATED | : May 23, 2006 |
| INVENTOR(S) | : Tsuyoshi Yamashita |

It is certified that error appears in the above-identified patent and that said Letters Patent is hereby corrected as shown below:

On Title Page, col. 1 Item (65)

Prior Publication Data

Correct the domestic priority claim information to include:

This application is a CON of PCT/JP02/06815 filed on 07/04/2002

This certificate supersedes Certificate of Correction issued August 22, 2006.

Signed and Sealed this

Tenth Day of October, 2006

JON W. DUDAS
*Director of the United States Patent and Trademark Office*